United States Patent [19]
Domenichini et al.

[11] Patent Number: 5,396,179
[45] Date of Patent: Mar. 7, 1995

[54] HIGH FREQUENCY SURGE TESTER METHODS AND APPARATUS

[75] Inventors: Carlo Domenichini, Poggibonsi; Massimo Linari, Tavarnelle Val di Pesa, both of Italy

[73] Assignee: Axis S.p.A., Florence, Italy

[21] Appl. No.: 85,301

[22] Filed: Jun. 29, 1993

Related U.S. Application Data

[62] Division of Ser. No. 796,643, Nov. 22, 1991, Pat. No. 5,256,977.

[51] Int. Cl.⁶ .............................................. G01R 31/06
[52] U.S. Cl. ..................................... 324/546; 324/520
[58] Field of Search ............... 324/102, 546, 536, 520, 324/158 M G; 340/646, 647; 29/605

[56] References Cited

U.S. PATENT DOCUMENTS

| | | |
|---|---|---|
| 2,996,664 | 8/1961 | Vogel . |
| 3,173,086 | 3/1965 | Kresge . |
| 3,763,399 | 10/1973 | Jenkins ................... 324/520 |
| 3,887,867 | 6/1975 | Safer et al. ............... 324/520 |
| 4,006,410 | 2/1977 | Roberts . |
| 4,064,464 | 12/1977 | Yoshino et al. ........... 324/102 |
| 4,356,443 | 10/1982 | Emery . |
| 4,577,151 | 3/1986 | Tanisaka et al. .......... 324/102 |
| 4,651,086 | 3/1987 | Domenichini et al. . |
| 4,779,051 | 10/1988 | Grunewald . |
| 5,111,149 | 5/1992 | Lebesch ................... 324/546 |
| 5,200,737 | 4/1993 | Konishi et al. ........... 324/520 |
| 5,233,795 | 6/1993 | Blades ..................... 324/536 |

FOREIGN PATENT DOCUMENTS

| | | |
|---|---|---|
| 415370 | 3/1991 | European Pat. Off. . |
| 932430 | 5/1982 | U.S.S.R. . |
| 955031 | 2/1983 | U.S.S.R. . |
| 9010241 | 9/1990 | WIPO . |

OTHER PUBLICATIONS

Rylander: "Testing Insulation with High Frequency", Electric Journal—Jan. 1928.
K.-H. Linsel et al., "Diagnose von Isloierungsfehlern in Wicklungen elektrischer Maschinen," *Elektrie*, vol. 42, No. 5, 1989, Berlin, West Germany, pp. 177–179.

*Primary Examiner*—Maura K. Regan
*Attorney, Agent, or Firm*—Fish & Neave; Robert R. Jackson; Robert W. Morris

[57] ABSTRACT

A high frequency surge tester includes a high frequency detection circuit which is used to detect microfracture defects in the insulation of wire on wound coils. The high frequency detection circuit includes a high-pass filter which isolates an errant voltage response so that it can be integrated and compared to threshold limits to determine the magnitude of defects. The surge tester also detects shorts between coils and shorts between turns of the same coil.

18 Claims, 8 Drawing Sheets

HIGH FREQUENCY SURGE TESTER METHODS AND APPARATUS

CROSS REFERENCE TO RELATED APPLICATION

This application is a division of U.S. patent application Ser. No. 07/796,643, filed Nov. 22, 1991, now U.S. Pat. No. 5,256,977.

BACKGROUND OF THE INVENTION

This invention relates to the testing of electric components having wound coils, and more particularly, to the use of a device which supplies a high frequency surge to test wound coils for such defects as shorts between coils, shorts between turns of the same coil, and defects found in the wires that form coils.

The manufacturing process for wound coil devices typically has many quality control steps to ensure that a satisfactory product is produced. One well known procedure for determining various defects in wound coils is called the "surge test". It is frequently desired that this test be conducted rapidly, but with precision, on each coil of a particular device to determine the overall quality of the device (e.g. coils of an armature connected to the bars of a commutator or coils of a stator connected to the terminals of an end mold).

Heretofore, the surge test has only had the capability to determine defects such as a short between coils in a winding or a short between turns on the same coil. If a defect has been introduced into the wire as part of the manufacturing process, such as a microfracture in the insulation material, it will not be found by the current surge test. Such defects can lead to precocious degradation of the coil and should be identified before incorporation into the final product.

In view of the foregoing, it is an object of this invention to provide an improved surge test to identify additional defects which can occur during the manufacturing of wound coil devices.

SUMMARY OF THE INVENTION

This and other objects of the invention are accomplished in accordance with the principles of the invention by providing an improved surge tester with the capability to detect microfracture defects in the wire of coil windings, as well as the more traditional defects (e.g., shorts between coils and/or shorts between turns of the same coil) related to the coil manufacturing process. A high frequency detection circuit having a high-pass filter, an amplifier, a rectifier, and an integrator are included in the surge tester. This additional circuitry is used to isolate and precisely measure the response generated by defects within the wire of coil windings. In this manner, microfracture defects, as well as traditional defects, can be detected within coil windings.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
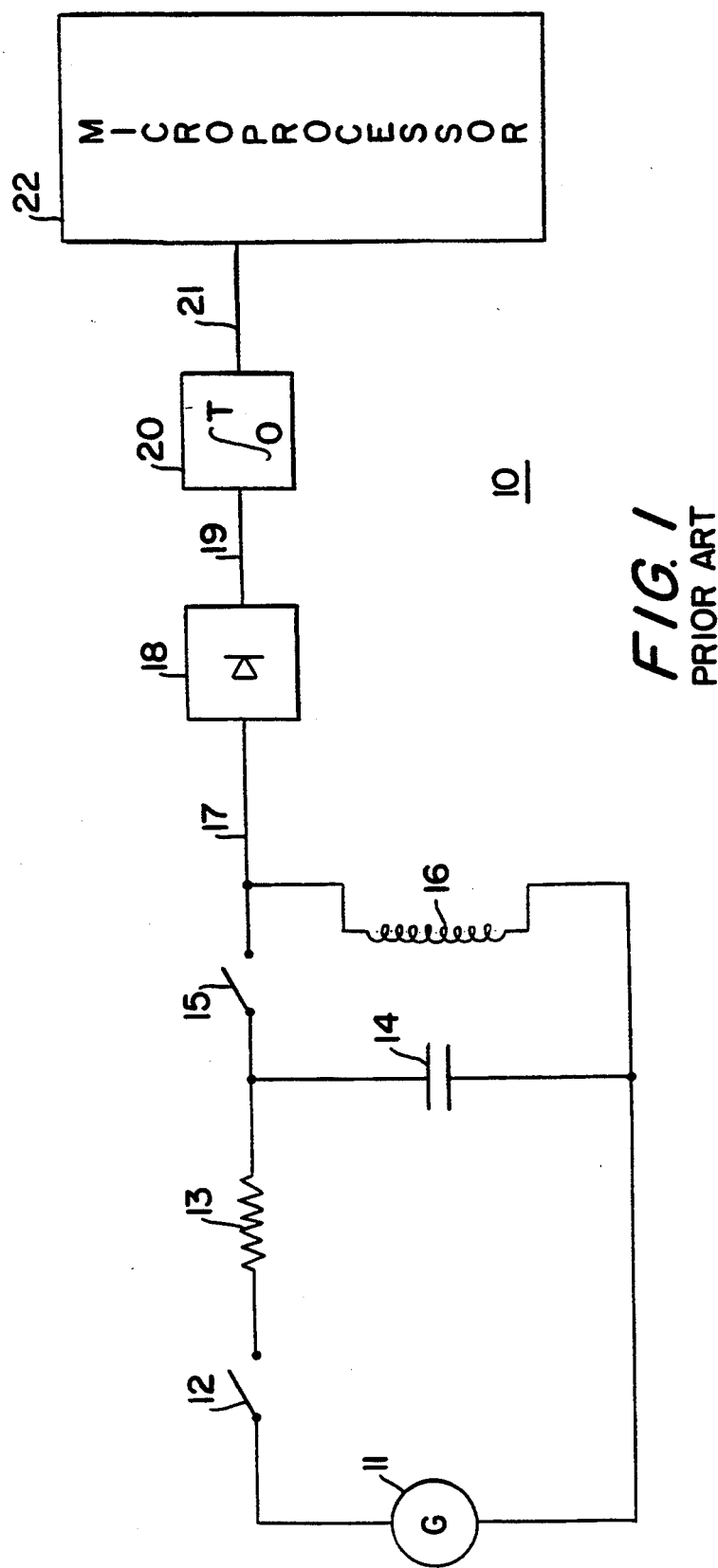
FIG. 1 is a schematic block diagram of prior art tester apparatus.

As shown in FIG. 1, a typical prior art surge tester 10 includes predetermined voltage source 11, switches 12 and 15, resistor 13, capacitor 14, full wave rectifier 18, integrator 20, and microprocessor 22. During normal testing of wound coil 16, switch 12 is closed to provide a path from predetermined voltage source 11 through resistor 13 to charge capacitor 14 with a required amount of energy. Once capacitor 14 has been sufficiently charged, switch 12 is opened and switch 15 is closed. This causes a damped oscillatory discharge of the energy stored in capacitor 14 via the RLC circuit comprising capacitor 14 and wound coil 16 (which provides both inductance L and resistance R). This discharge is monitored by the signal which travels along path 17 to rectifier 18, then along path 19 to integrator 20, before flowing along path 21 to microprocessor 22.

Figure 2:
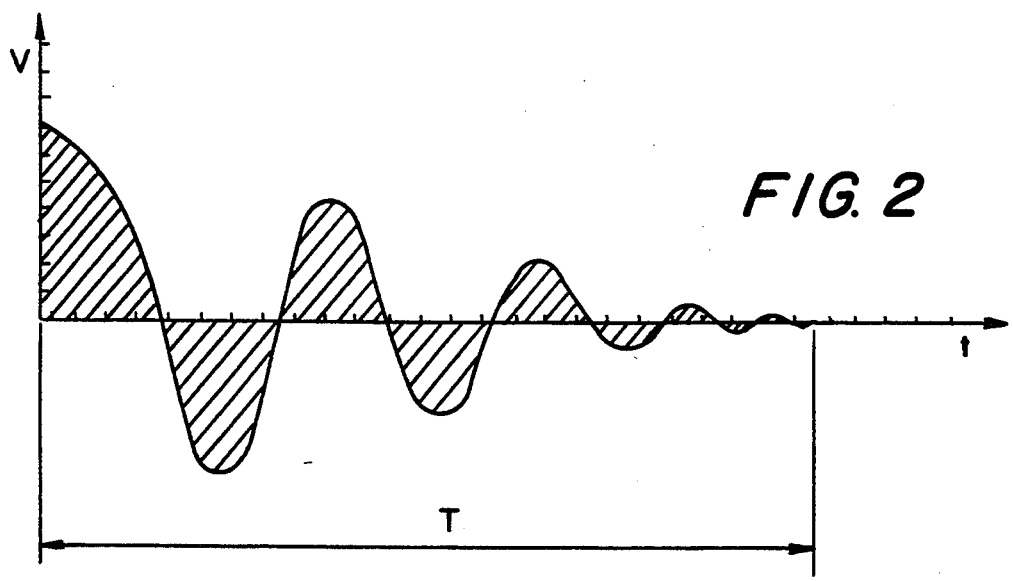
FIG. 2 is a graph displaying voltage versus time of the main response generated by a perfect wound coil in the tester of FIG. 1.
Figure 3:
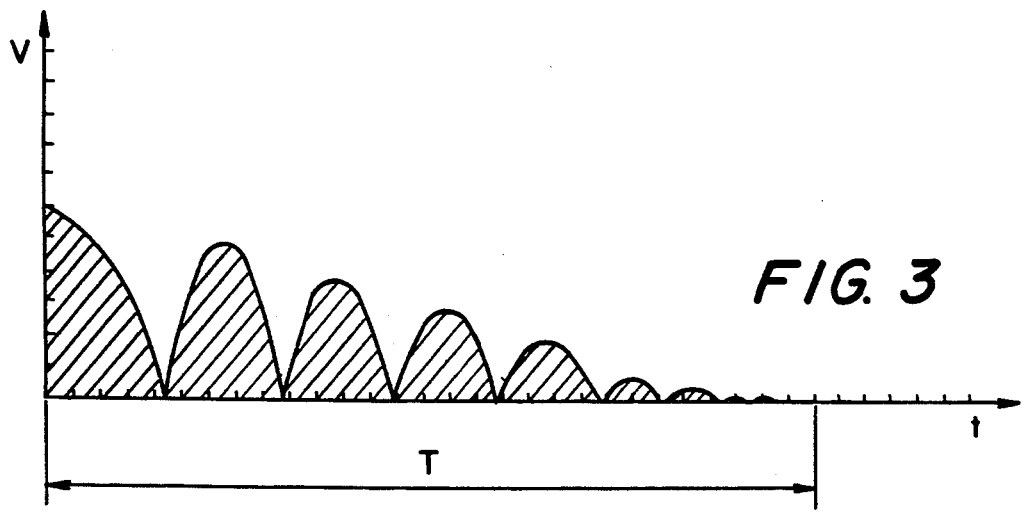
FIG. 3 is a graph displaying the same signal as FIG. 2 after it has passed through a full wave rectifying circuit.
Figure 4:
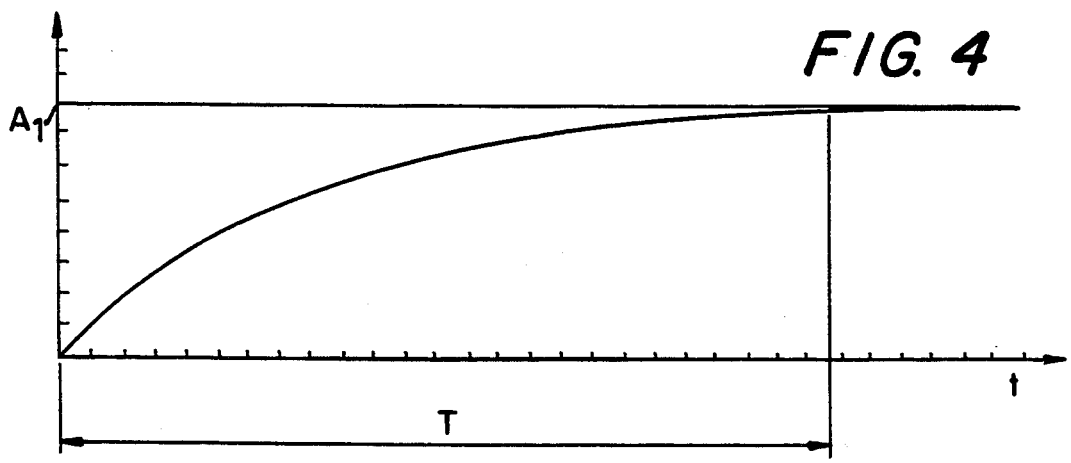
FIG. 4 is a graph displaying the approximate integration of the signal of FIG. 3.

FIG. 2 is a graph showing the voltage response of wound coil 16 seen at path 17 during the discharge of capacitor 14, assuming a perfect wound coil. FIG. 3 is a graph showing the same signal at path 19 after it has been rectified by rectifier 18. FIG. 4 is a graph which shows the same signal at path 21 after it has been integrated by integrator 20. Microprocessor 22 receives the analog signal and converts it to a digital signal using an internal analog-to-digital (A/D) converter.

Figure 5:
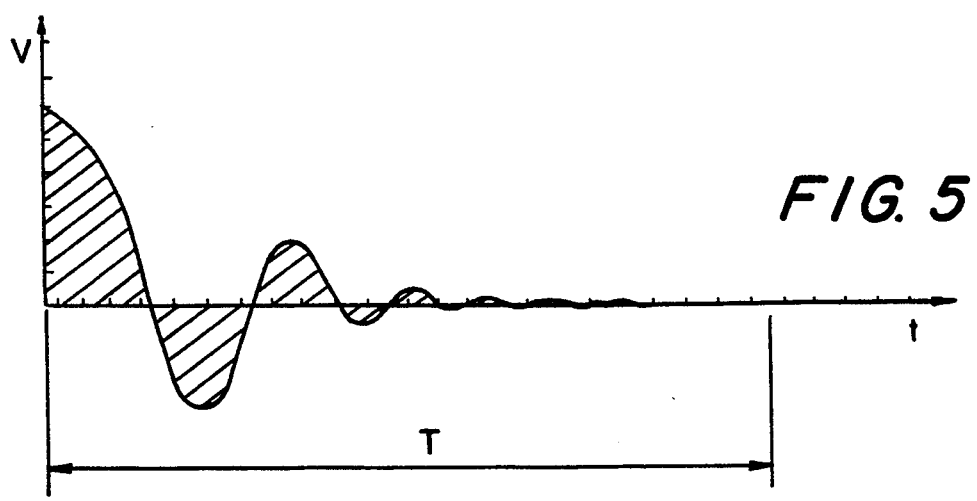
FIG. 5 is a graph displaying voltage versus time of the main response generated by a wound coil with a defect in the tester of FIG. 1.
Figure 6:
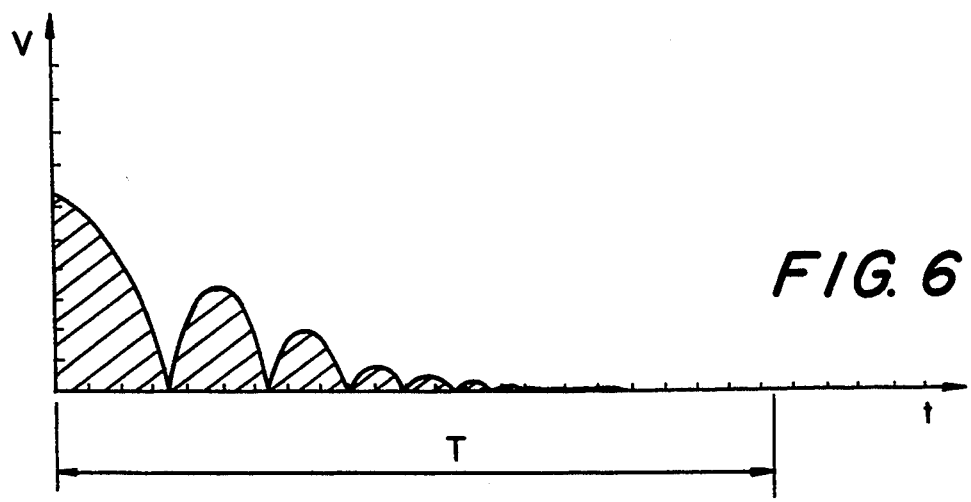
FIG. 6 is a graph displaying the same signal as FIG. 5 after it has passed through a full wave rectifying circuit.
Figure 7:
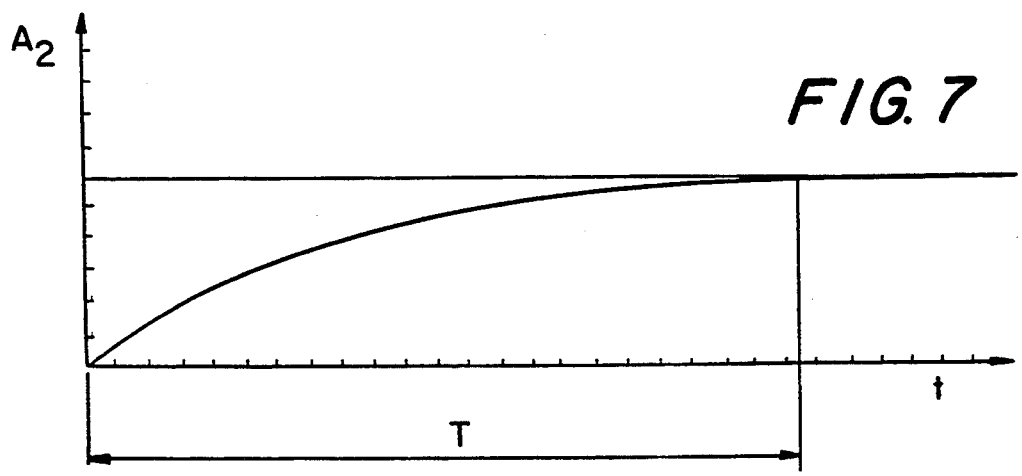
FIG. 7 is a graph displaying the approximate integration of the signal of FIG. 6.

FIGS. 5, 6, and 7 are respectively similar to FIGS. 2, 3, and 4, but show the voltage response of a wound coil containing defects of the kind which are detectable by the apparatus of FIG. 1. Note the lower amplitude and the decreased time required for the discharge signal to approach zero in FIGS. 5 and 6 as compared to the signal in FIGS. 2 and 3. In FIGS. 2, 3, 5, and 6, time O represents the time when the discharge voltage has reached a maximum value. Microprocessor 22 compares the final amplitude of the signal in FIG. 7 to predetermined upper and lower threshold limits, which are based upon the signal in FIG. 4, to determine the presence and magnitude of traditionally detectable defects. The wound coil being tested can therefore be classified accordingly.

An alternative embodiment of prior art exists for determining the presence of traditionally detectable defects, whereby a voltage source is connected directly to a wound coil being tested. From a precise instant when current circulating in the wound coil has reached a predetermined value, the current from the voltage source is interrupted and the corresponding output signal across the wound coil is measured for a peak value. This peak value is then compared to preexisting threshold values to determine the presence of defects in the wound coil. Due to the fact that there is less data to analyze using this test procedure (peak value versus complete output signal), this method may be somewhat less precise than the foregoing procedure.

The present invention is an improvement on the first prior art described above, which can determine the presence of additional defects in wound coils. These additional defects, which cannot be found using any of the prior art above, typically comprise microfractures in the insulation material which covers the main conductor of the wound coil. The extent and quantity of microfractures can increase during the winding operation, due to the periodic impact of the wire against the guide members which place the wire in the correct position on the coil. The microfractures can expose the main conductor to ambient gases within the final appliance. During normal functioning of the wound coil, discharge can occur from the exposed main conductor which can cause ionization of the ambient gases. Although this phenomenon is not fully understood by the wire manufacturers, analysis has shown that an excessive amount of such defects can lead to precocious degradation of the wound coil.

Figure 8:
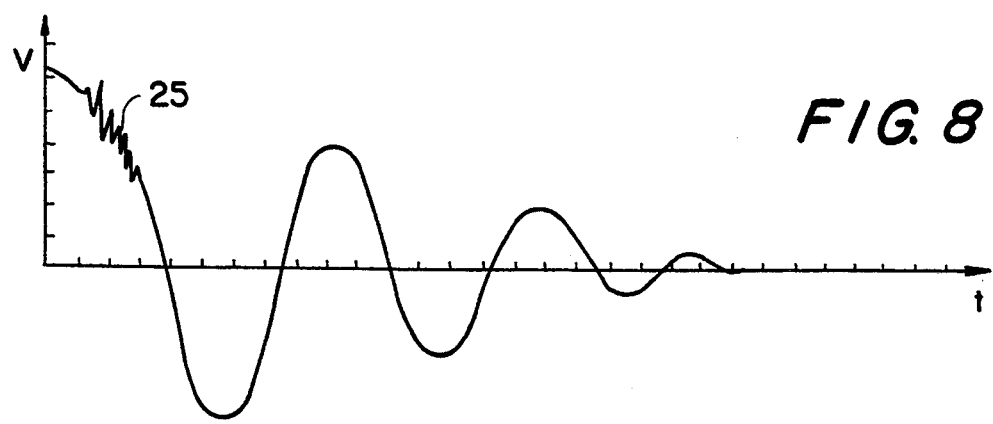
FIG. 8 is a graph displaying voltage versus time showing the response of a microfractured wire within the main response generated by an otherwise perfect wound coil.

A detailed analysis of the voltage response of surge tester 10 has revealed the presence of an additional response 25 within the main response (especially the higher voltage portions of the main response) when microfractures are present, as shown in FIG. 8. Response 25 typically has a frequency between 1-10 MHz versus 10-150 KHz for a typical main response. These frequencies tend to vary within the given ranges depending on the characteristics of the wound coil being tested. In order to detect the presence and magnitude of response 25, further analysis capability is added to the surge tester in accordance with the present invention.

Figure 9:
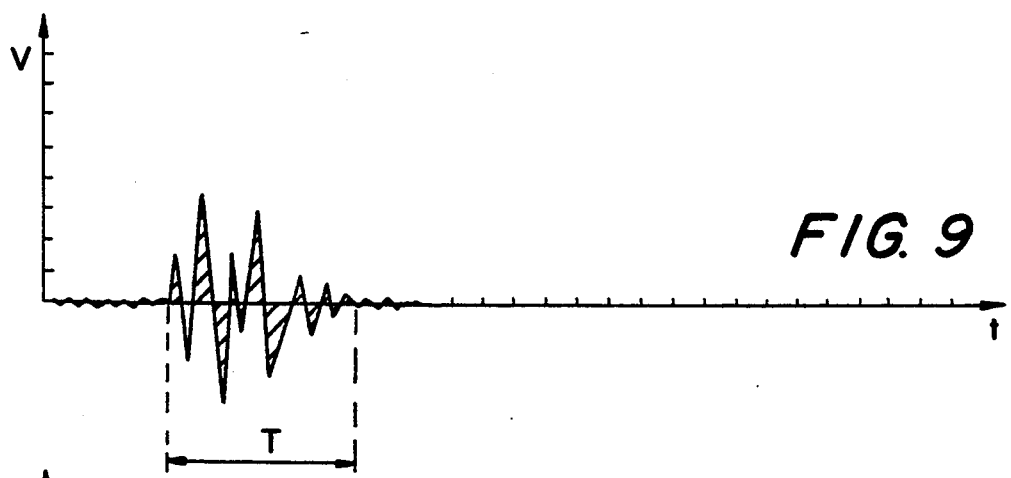
FIG. 9 is a graph displaying voltage versus time of the response of FIG. 8 with the high frequency portion of that response isolated in accordance with this invention. (The time base of FIGS. 9-11 is different from the time base of FIGS. 2-8.)
Figure 10:
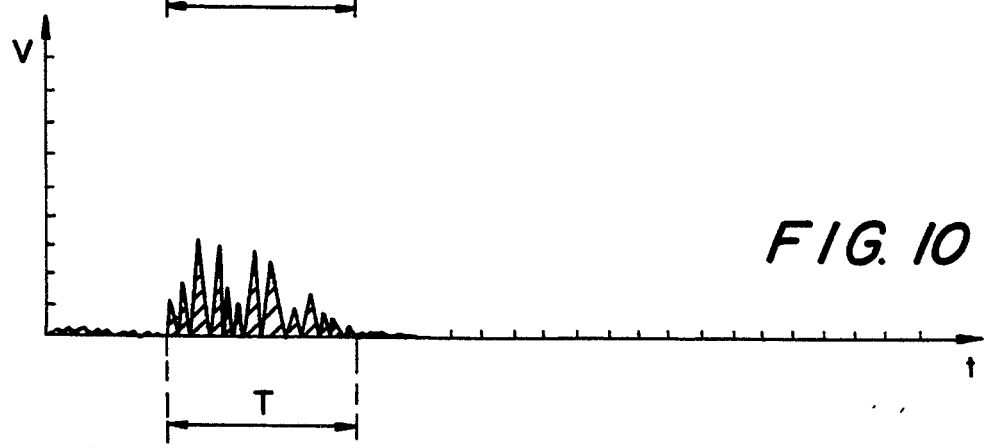
FIG. 10 is a graph displaying the same signal as FIG. 9 after it has passed through a full wave rectifying circuit in accordance with this invention.
Figure 11:
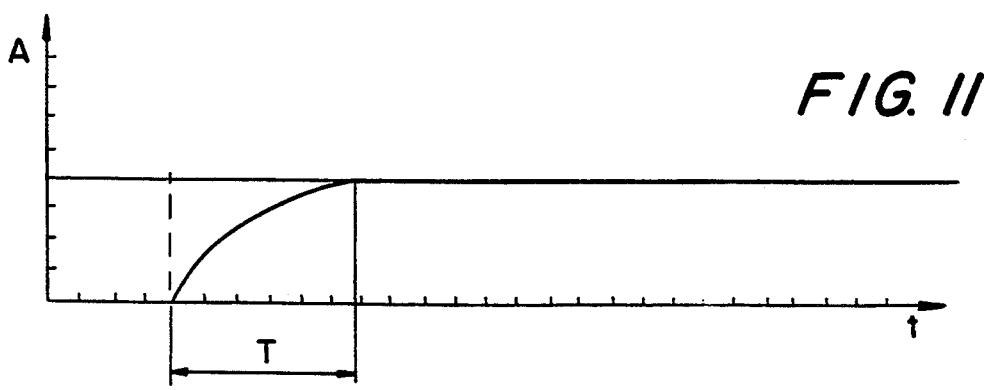
FIG. 11 is a graph displaying the approximate integration of the signal of FIG. 10 in accordance with this invention.
Figure 12:
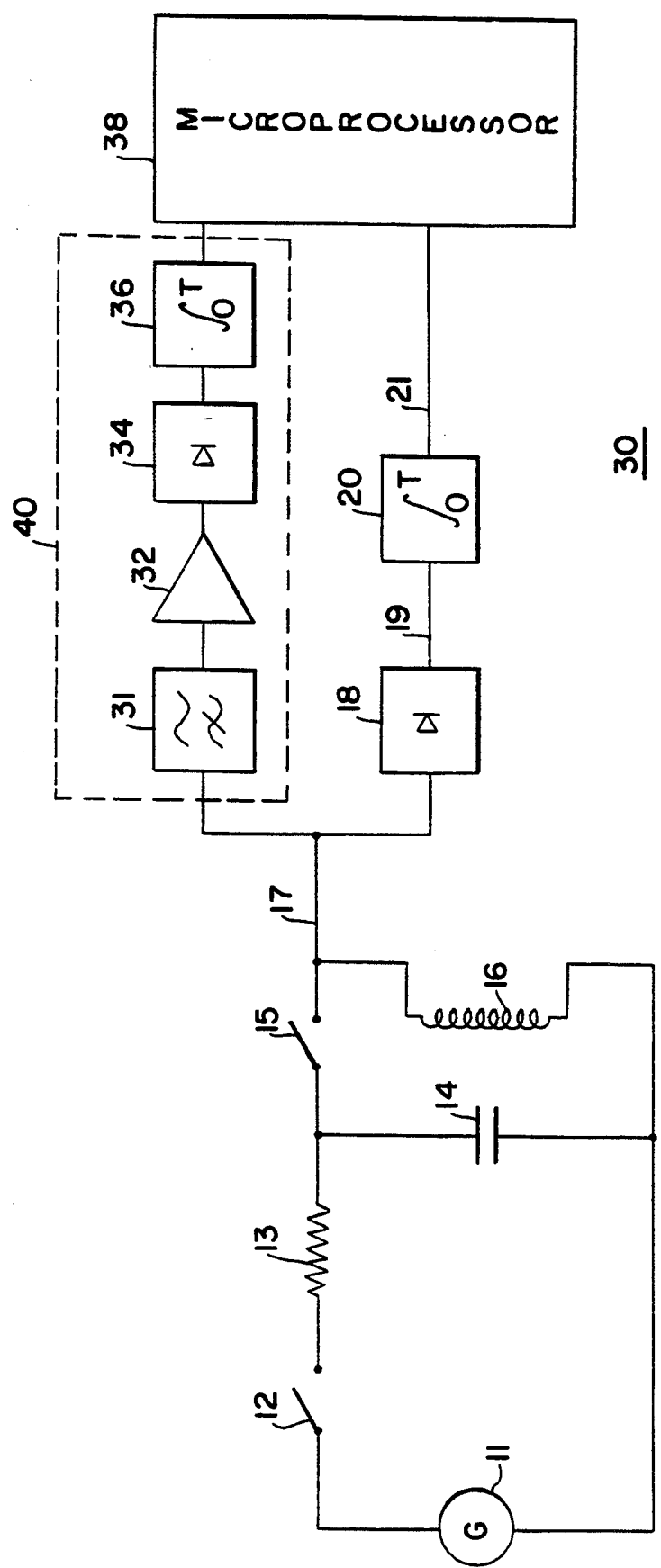
FIG. 12 is a schematic block diagram showing an illustrative embodiment of tester apparatus constructed in accordance with the principles of this invention.
Figure 13:
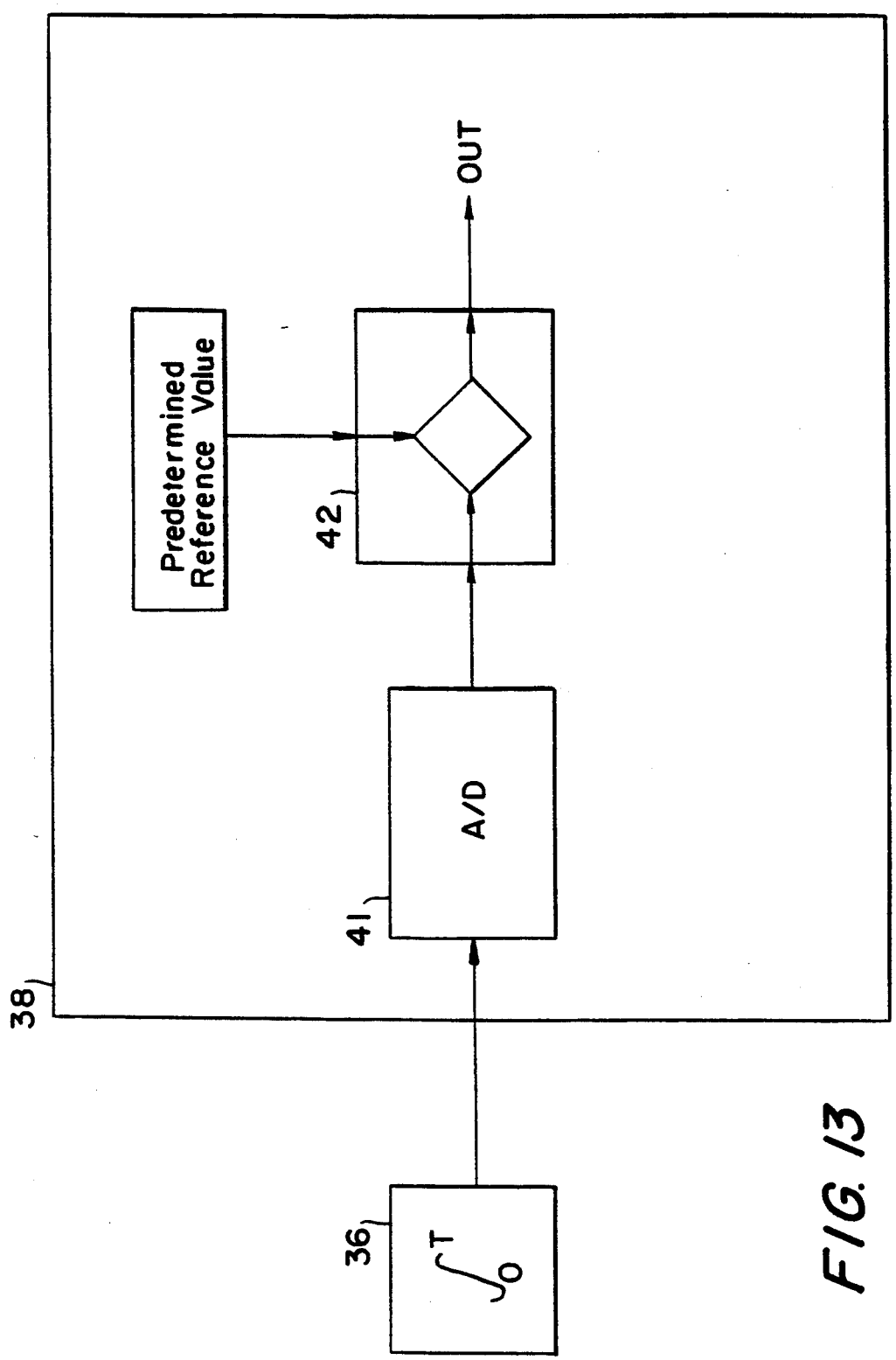
FIG. 13 is a block diagram showing partial operation of the microprocessor in FIG. 12.

As shown in FIG. 12, the improved surge tester 30 of this invention includes all of the circuitry of surge tester 10, with the addition of high-pass filter 31, amplifier 32, full wave rectifier 34, integrator 36, and improved (or at least reprogrammed) microprocessor 38 (which replaces microprocessor 22). Surge tester 30 detects traditionally detectable defects in the same manner as surge tester 10. Microfracture defects are detected by the addition of analysis circuit 40, which is connected in parallel to the original analysis circuit. The discharge-monitoring signal travels along path 17, as in surge tester 10, but follows an additional, parallel path to high-pass filter 31, which isolates response 25. Amplifier 32 can be utilized to amplify the signal, as shown in FIG. 9, and outputs it to rectifier 34. The signal is rectified by rectifier 34, as shown in FIG. 10, and passed to integrator 36 for integration. The integrated signal, as shown in FIG. 13, is passed to microprocessor 38, where, after going through A/D converter 41, a comparison is made between the integrated signal and one or more predetermined reference values by comparator 42 to determine the presence and extent of microfractures in wound coil 16.

Figure 14:
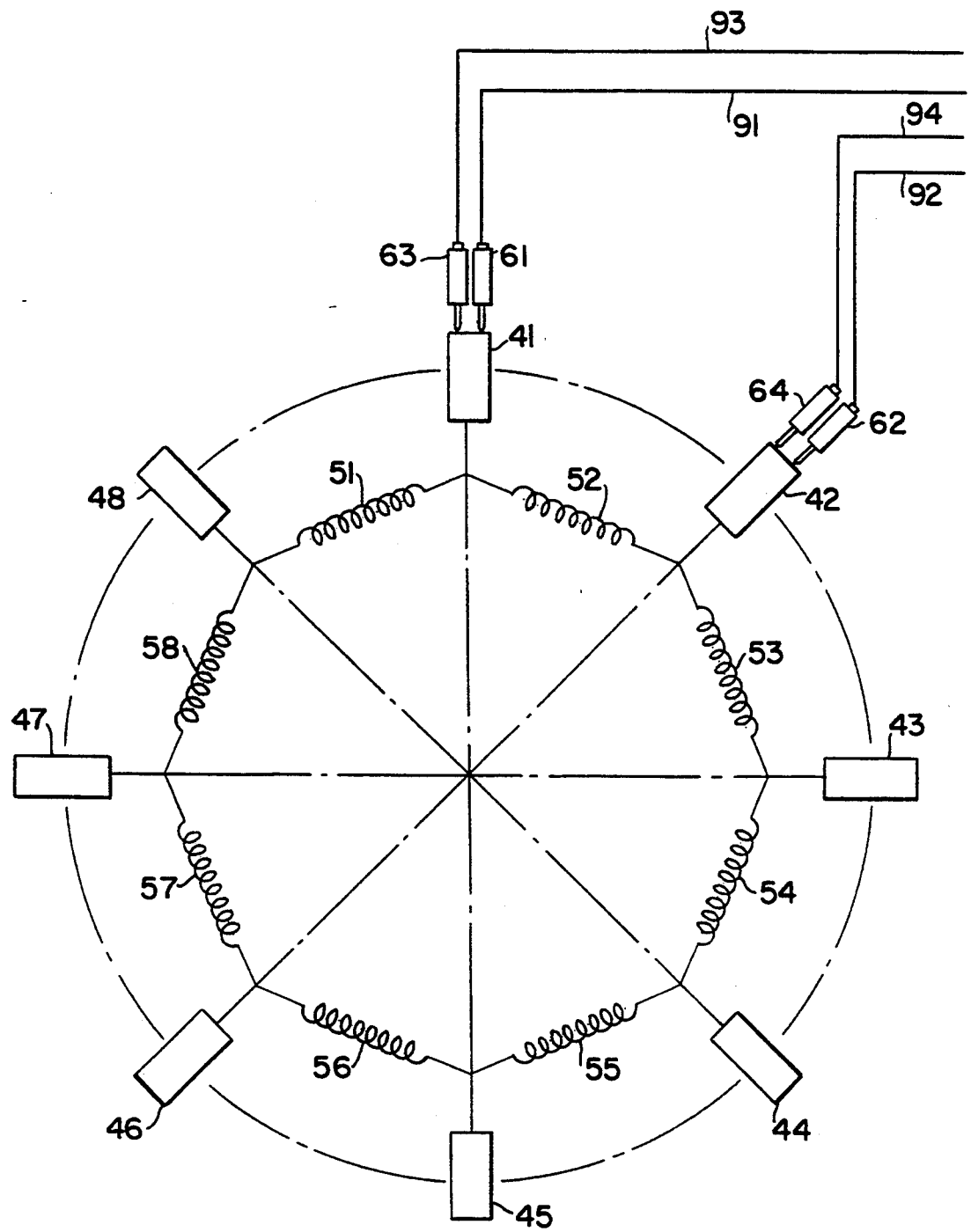
FIG. 14 is a schematic diagram of an electric motor armature to which contact probes are being applied from the tester of this invention.

FIG. 14 shows an illustrative example using the invention to test for defects in a wound armature having a commutator. In this example, the armature has eight coils 51-58, whereby each coil is terminated between two of commutator bars 41-48. Surge tester 30 has four lines 91, 92, 93, and 94, which are connected to four probes 61, 62, 63, and 64, which make contact with a pair of commutator bars for testing the coil connected between those bars. Probes 61 and 62 apply a potential across the coil being tested. Probes 63 and 64 are used to monitor the potential across the coil during discharge. After each coil is tested, the armature is angularly indexed to place the next coil in position in front of probes 61, 62, 63, and 64 for testing. This process is therefore very conducive to automated manufacturing.

Figure 15:
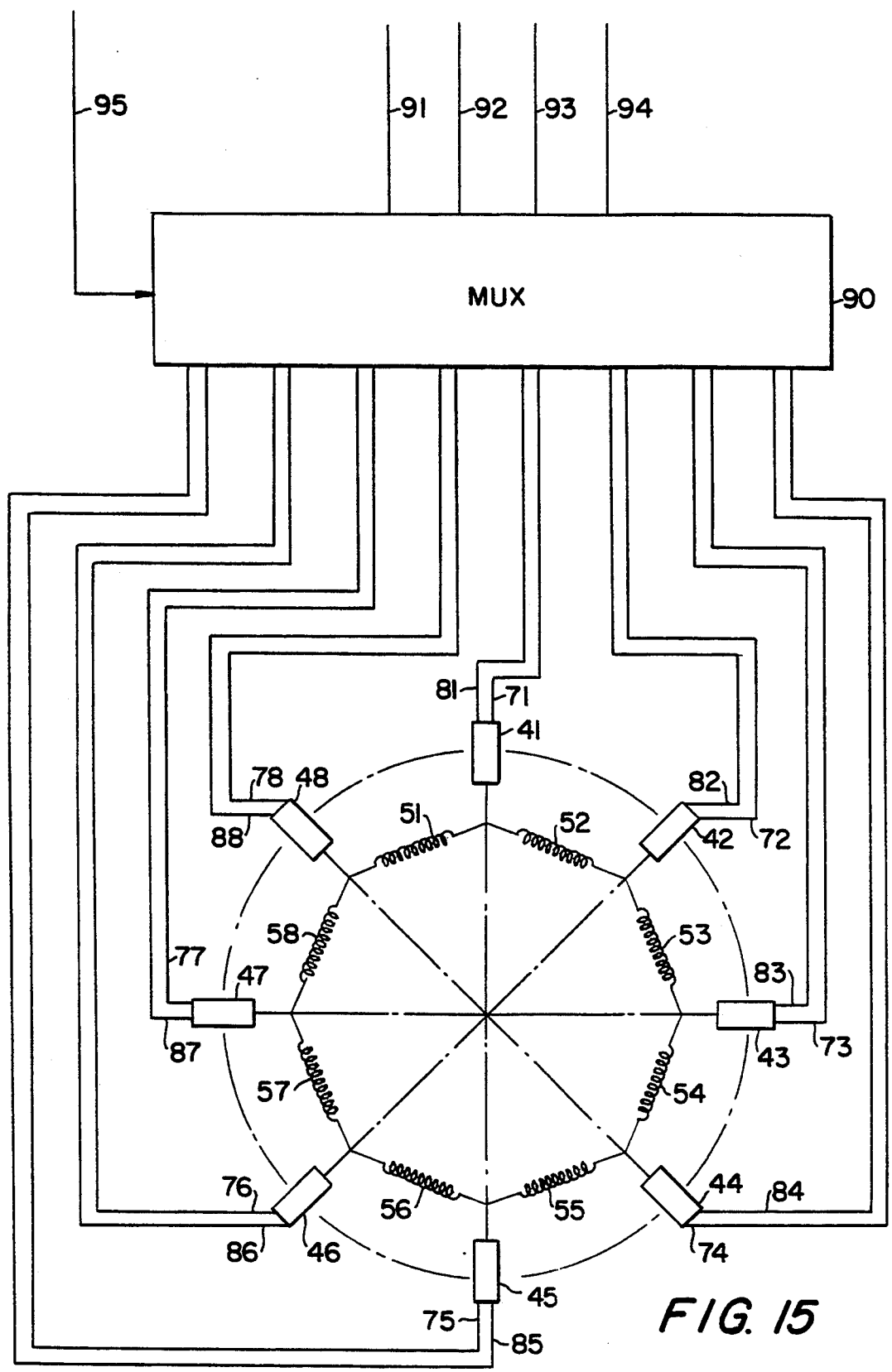
FIG. 15 is a schematic diagram of an electric motor armatore to which contact probes are being applied in an alternate manner from the tester of this invention.

FIG. 15 shows an alternative illustrative embodiment using the invention to test for defects in a wound armature having a commutator. As in FIG. 14, the armature has eight coils 51-58, each coil being connected between two of commutator bars 41-48. In this example, eight pairs of probes 71,81-78,88 make contact with corresponding commutator bars 41-48. A charge potential is applied to each coil, in sequence, from lines 91 and 92 through multiplexer 90, via lines 71-78. The discharge potential is monitored via lines 81-88, through multiplexer 90 to lines 93 and 94. The sequencing of the applied and monitored signals is controlled by multiplexer 90 based upon control signals from microprocessor 38 (which is connected to multiplexer 90 via line 95). This process does not require indexing of the armature and is therefore also very conducive to automated manufacturing.

It will be understood that the foregoing is merely illustrative of the principles of this invention, and that various modifications can be made by those skilled in the art without departing from the scope and spirit of the invention. For example, a database can be established within microprocessor 38 containing different predetermined threshold limits for various devices, thereby simplifying the manufacturing and testing process for multiple devices.

The invention claimed is:

1. A surge tester for testing an input signal generated by a wound coil during manufacturing of a wound coil device comprising:
   a predetermined voltage source having a positive and a negative terminal;
   a resistor;
   a microprocessor having processing means;
   a first switch connected in series between said resistor and a first of said positive and negative terminals of said predetermined voltage source;

a second switch connected in series between said resistor and one end of said wound coil being tested, with the other end of said wound coil being connected to a second of said positive and negative terminals of said predetermined voltage source;

a capacitor connected in series between a node in the series connection of said resistor and said second switch, and said second of said positive and negative terminals of said predetermined voltage source; and a high frequency analysis circuit which extracts and modifies a high frequency component from said input signal, connected in series between said microprocessor and a node in said series connection of said second switch and said one end of said wound coil, said modified high frequency component being of a substantially higher frequency than the relatively low frequency main response of said coil, and wherein said processing means analyzes said modified high frequency component in order to detect microfracture defects in the insulation of a wire in said wound coil.

2. The apparatus defined in claim 1 wherein said processing means comprises:

an analog to digital converter for converting said modified high frequency response to a digital value; and means for comparing said digital value to one or more predetermined threshold values.

3. The surge tester defined in claim 2, wherein said means for comparing determines whether said wound coil contains at least one wire having insulation with microfracture defects based on said comparision of said digital value to said one or more threshold values.

4. The apparatus defined in claim 1 wherein said high frequency analysis circuit comprises:

an integrator which integrates said high frequency response, having an input and an output which is connected to said microprocessor;

a rectifier having an input and an output which is connected to said input of said integrator, which rectifies said high frequency response; and a high-pass filter which isolates said high frequency response, connected in series between a node in said series connection of said second switch and said wound coil, and said input of said rectifier.

5. The apparatus defined in claim 4 including an amplifier which amplifies said high frequency response, having an input connected to said high-pass filter and an output connected to said input of said rectifier.

6. The apparatus defined in claim 1 including a main response analysis circuit which modifies said input signal, connected in series between said microprocessor and a node in said series connection of said second switch and said one end of said wound coil.

7. The apparatus defined in claim 1 wherein said processing means comprises:

means for comparing said modified high frequency component to one or more predetermined values in order to detect microfracture defects in the insulation of a wire in said wound coil.

8. A method for detecting defects in a wound coil during the manufacturing of said coil comprising the steps of:

connecting said coil to a surge tester;

subjecting said coil to an electrical surge in order to cause an oscillatory response in said coil;

sensing said oscillatory response of said coil;

using a microprocessor to analyze a high frequency component of said oscillatory response of said coil in order to detect microfracture defects in the insulation of a wire in said wound coil, said high frequency component being of a substantially higher frequency than the main oscillatory response of said coil.

9. The method defined in claim 8 further comprising the step of filtering said oscillatory response of said coil in order to identify said high frequency component.

10. The method defined in claim 9 wherein the step of using a microprocessor to analyze a high frequency component in order to detect microfracture defects in the insulation of a wire in said wound coil further comprises the steps of:

modifying said high frequency component; and comparing said modified high frequency component to one or more predetermined threshold values.

11. The method defined in claim 10 wherein the step of modifying said high frequency component comprises the steps of sequentially:

rectifying said high frequency component; and integrating said high frequency component.

12. The method defined in claim 10 wherein the step of comparing said modified high frequency component to one or more predetermined threshold values comprises comparing a digital value to one or more predetermined digital values.

13. The method defined in claim 8 wherein the step of sensing said oscillatory response of said coil comprises the step of digitizing said oscillatory response of said coil.

14. The method defined in claim 8 wherein the step of using a microprocessor to analyze a high frequency component of said oscillatory response of said coil in order to detect microfracture defects in the insulation of a wire in said wound coil comprises the steps of:

modifying said high frequency component; and comparing said modified high frequency component to one or more predetermined threshold values.

15. The method defined in claim 14 wherein the step of modifying said high frequency component comprises the steps of sequentially:

rectifying said high frequency component; and integrating said high frequency component.

16. The method defined in claim 15 wherein the step of modifying said high frequency component further comprises the step of amplifying said high frequency component before rectifying said high frequency component.

17. The method defined in claim 14 wherein the step of using a microprocessor to analyze a high frequency component of said oscillatory response of said coil further comprises the step of filtering said oscillatory response of said coil in order to identify said high frequency component.

18. The method defined in claim 14 wherein the step of comparing said modified high frequency component to one or more predetermined threshold values comprises comparing a digital value to one or more predetermined digital values.

* * * * *